(12) United States Patent
Jin et al.

(10) Patent No.: US 8,901,574 B2
(45) Date of Patent: Dec. 2, 2014

(54) LIGHT EMITTING DIODES

(71) Applicants: Tsinghua University, Beijing (CN); Hon Hai Precision Industry Co., Ltd., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/304,058

(22) Filed: Jun. 13, 2014

(65) Prior Publication Data

US 2014/0291718 A1 Oct. 2, 2014

Related U.S. Application Data

(63) Continuation of application No. 13/728,006, filed on Dec. 27, 2012, now Pat. No. 8,796,720.

(30) Foreign Application Priority Data

Mar. 30, 2012 (CN) .................. 2012 1 00890606

(51) Int. Cl.
*H01L 27/15* (2006.01)
(Continued)

(52) U.S. Cl.
CPC ................ *H01L 33/08* (2013.01); *H01L 33/10* (2013.01); *H01L 33/30* (2013.01)
USPC .................... 257/79; 438/22; 257/88; 257/89; 257/98

(58) Field of Classification Search
CPC ....... H01L 33/405; H01L 33/22; H01L 33/20; H01L 33/382; H01L 33/38; H01L 33/46; H01L 2933/0016; H01L 33/06; H01L 33/387; H01L 33/60; H01L 27/15; H01L 33/10; H01L 33/32; H01L 33/007; H01L 33/08; H01L 33/24; H01L 33/30

USPC .......... 257/40, 13, 66, 72, 79–103, 223, 227, 257/291, 292, 439, 443, 655, 642–643, 257/759; 438/29, 22, 26, 27, 42, 47, 28, 25, 438/33, 38, 39, 46, 669, 20, 69, 82, 991, 49, 438/486, 24, 31, 40, 43, 455, 458, 459, 478, 438/479, 48, 694, 700, 704, 745, 93, 940, 438/964, 970, 977; 313/498, 506, 501, 502; 362/97.1, 294, 362, 373, 800, 97.2, 362/232, 236, 240, 249.02, 249.04, 249.06, 362/368, 372, 375, 546, 610, 612, 615, 652, 362/84, 97.3
See application file for complete search history.

(56) References Cited

U.S. PATENT DOCUMENTS 7,202,506 B1 4/2007 Denbaars et al.
7,884,378 B1 2/2011 Lu et al.
(Continued)

FOREIGN PATENT DOCUMENTS

TW 472401 1/2002
TW 201106459 2/2011

*Primary Examiner* — Colleen A Matthews
*Assistant Examiner* — Junaiden Mirsalahuddin
(74) *Attorney, Agent, or Firm* — Novak Druce Connolly Bove + Quigg LLP

(57) ABSTRACT

A LED includes a red light emitting unit, a green light emitting unit, a blue light emitting unit, and an optical grating located on a same plane. The red light emitting unit, the green light emitting unit and the blue light emitting unit are located around the optical grating. Each light emitting unit includes a first substrate, a first semiconductor layer, an first active layer, a second semiconductor layer and a first reflector layer stacked in that order. The optical grating includes a second substrate, a first semiconductor layer, an active layer, and a second semiconductor layer stacked in that order. The second substrate and the three first substrates are a continuous integrated substrate structure.

15 Claims, 7 Drawing Sheets

(51) Int. Cl.
*H01L 29/18* (2006.01)
*H01L 33/00* (2010.01)
*H01L 29/20* (2006.01)
*H01L 33/08* (2010.01)
*H01L 33/10* (2010.01)
*H01L 33/30* (2010.01)

(56) References Cited

U.S. PATENT DOCUMENTS

| | | | |
|---|---|---|---|
| 8,035,117 B2 * | 10/2011 | DenBaars et al. | 257/89 |
| 2009/0046479 A1 * | 2/2009 | Bierhuizen et al. | 362/612 |
| 2009/0140630 A1 * | 6/2009 | Kijima et al. | 313/498 |

* cited by examiner

LIGHT EMITTING DIODES

CROSS-REFERENCE TO RELATED APPLICATIONS

This application is a continuation application of U.S. patent application Ser. No. 13/728,006, filed on Dec. 27, 2012, entitled "WHITE LIGHT EMITTING DIODES", which claims all benefits accruing under 35 U.S.C. §119 from China Patent Application No. 201210089060.6, filed on Mar. 30, 2012 in the China Intellectual Property Office, the disclosure of which is incorporated herein by reference. This application is related to applications entitled, "METHOD FOR MAKING SOLAR CELLS", Ser. No. 13/727,988, filed on Dec. 27, 2012, "SOLAR CELLS", Ser. No. 13/727,999, filed on Dec. 27, 2012, "METHOD FOR MAKING LIGHT EMITTING DIODES", Ser. No. 13/728,018, filed on Dec. 27, 2012, "LIGHT EMITTING DIODE", Ser. No. 13/728,031, filed on Dec. 27, 2012, "LIGHT EMITTING DIODES", Ser. No. 13/728,035, filed on Dec. 27, 2012, "METHOD FOR MAKING LIGHT EMITTING DIODES", Ser. No. 13/728,043, filed on Dec. 27, 2012, "LIGHT EMITTING DIODES", Ser. No. 13/728,054, filed on Dec. 27, 2012, "LIGHT EMITTING DIODES AND OPTICAL ELEMENTS", Ser. No. 13/728,063, filed on Dec. 27, 2012, and "METHOD FOR MAKING LIGHT EMITTING DIODES AND OPTICAL ELEMENTS", Ser. No. 13/728,076, filed on Dec. 27, 2012.

BACKGROUND

1. Technical Field

The present disclosure relates to a light emitting diode (LED).

2. Discussion of Related Art

LEDs have higher energy conversion efficiency, higher radiance (i.e., they emit a larger quantity of light per unit area), longer lifetime, higher response speed, generate less heat, and have better reliability than conventional light sources. Therefore, LED modules are widely used as light sources in optical imaging systems, especially white LED.

A conventional white LED mainly includes the following two different structures. One kind of the conventional white LED includes a blue LED structure and a yellow fluorescent powder coated on the blue LED structure. Parts of blue light emitted from the blue LED structure will be absorbed by the yellow fluorescent powder to emit yellow light. The other parts of blue light and the yellow light will mix to emit the white light. However, the efficiency of this kind of the white LED is low. Another kind of the conventional white LED includes a blue LED chip, a green LED chip and a red LED chip stacked together. The blue light, green light and red light emitted from the blue LED chip, the green LED chip and the red LED chip respectively will mix to form the white light. However, a method for making this kind of the white LED is complicated and costly.

What is needed, therefore, is to provide a light emitting diode, which can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
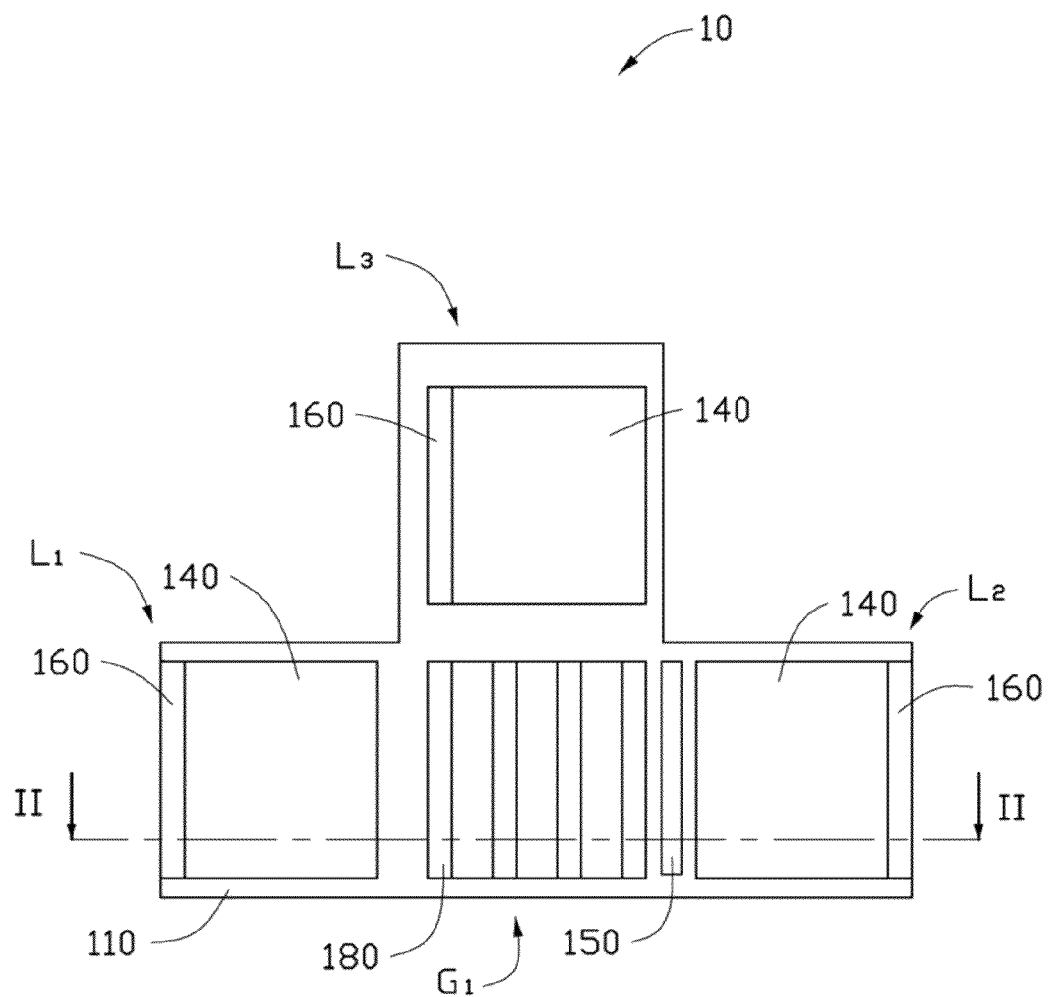
FIG. 1 is a top view of one embodiment of white LED.
Figure 2:
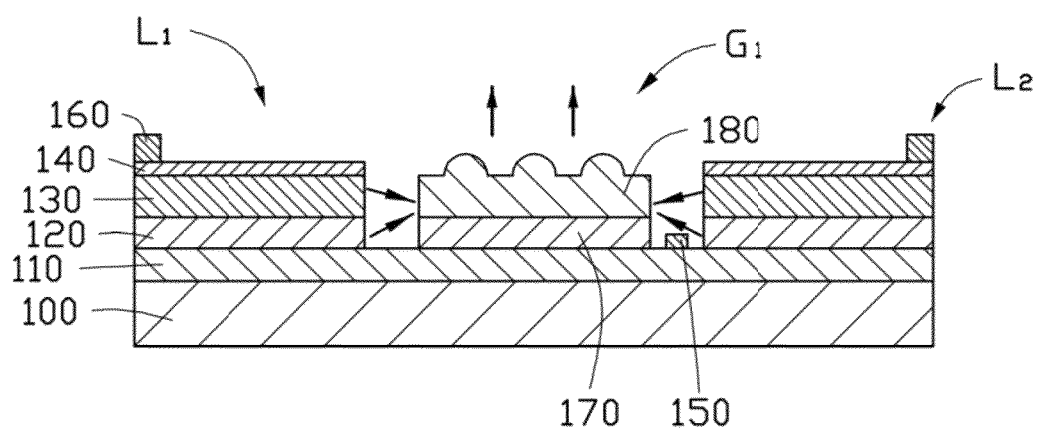
FIG. 2 is a cross-section of the white LED along line II-II' of FIG. 1.

FIGS. 1 and 2 illustrate one embodiment of a white LED 10. The white LED 10 includes a light emitting unit $L_1$, a light emitting unit $L_2$, a light emitting unit $L_3$, and an optical grating $G_1$. The light emitting unit $L_1$, the light emitting unit $L_2$, the light emitting unit $L_3$, and the optical grating $G_1$ are located on a same plane. The light emitting unit $L_1$, the light emitting unit $L_2$, and the light emitting unit $L_3$ are located around the optical grating $G_1$. The light emitting unit $L_1$ is a red LED chip, the light emitting unit $L_2$ is a green LED chip, and the light emitting unit $L_3$ is a blue LED chip.

The light emitting unit $L_1$, the light emitting unit $L_2$, and the light emitting unit $L_3$ have a same LED structure which includes a substrate 100, a first semiconductor layer 110, an active layer 120, a second semiconductor layer 130, a first reflector layer 140, a first electrode 150, and a second electrode 160. The optical grating $G_1$ includes a substrate 100, a first semiconductor layer 110, an active layer 170, and a second semiconductor layer 180. The light emitting unit $L_1$, the light emitting unit $L_2$, the light emitting unit $L_3$, and the optical grating $G_1$ are an integrated structure. The light emitting unit $L_1$, the light emitting unit $L_2$, the light emitting unit $L_3$, and the optical grating $G_1$ share the same substrate 100 and the same first semiconductor layer 110 to form an integrated structure. Because the light emitting unit $L_1$, the light emitting unit $L_2$, and the light emitting unit $L_3$ share the same first semiconductor layer 110, only one first electrode 150 is needed.

The substrate 100 is adapted to support the first semiconductor layer 110. A size, thickness, and shape of the substrate 100 can be selected according to need. The substrate 100 can include an epitaxial growth surface which is used to grow the first semiconductor layer 110. The epitaxial growth surface can be a clean and smooth surface. A material of the substrate 100 can be $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The first semiconductor layer 110 and the substrate 100 should have a small crystal lattice mismatch and a thermal expansion mismatch. In one embodiment, the substrate 100 is a sapphire substrate having a thickness of about 400 micron.

The first semiconductor layer 110 can be located on the epitaxial growth surface of the substrate 100. The first semiconductor layer 110 can be an N-type semiconductor or a P-type semiconductor. A material of the N-type semiconductor can include N-type gallium nitride, N-type gallium arsenide, or N-type copper phosphate. A material of the P-type semiconductor can include P-type gallium nitride, P-type gallium arsenide, or P-type copper phosphate. The N-type semiconductor can be used to provide electrons, and the P-type semiconductor can be configured to provide holes. A thickness of the first semiconductor layer 110 can range from about 1 micron to about 5 micron. In one embodiment, the first semiconductor layer 110 is an N-type gallium nitride semiconductor layer.

In one embodiment, the white LED 10 further includes a buffer layer (not shown) located on the epitaxial growth surface of substrate 100. Because the first semiconductor layer 110 and the substrate 100 have different lattice constants, the buffer layer can be used to reduce the lattice mismatch. As such, the dislocation density of the first semiconductor layer 110 will decrease. A thickness of the buffer layer can range from about 10 nanometers to about 300 nanometers. A material of the buffer layer can be GaN or AlN.

Figure 3:
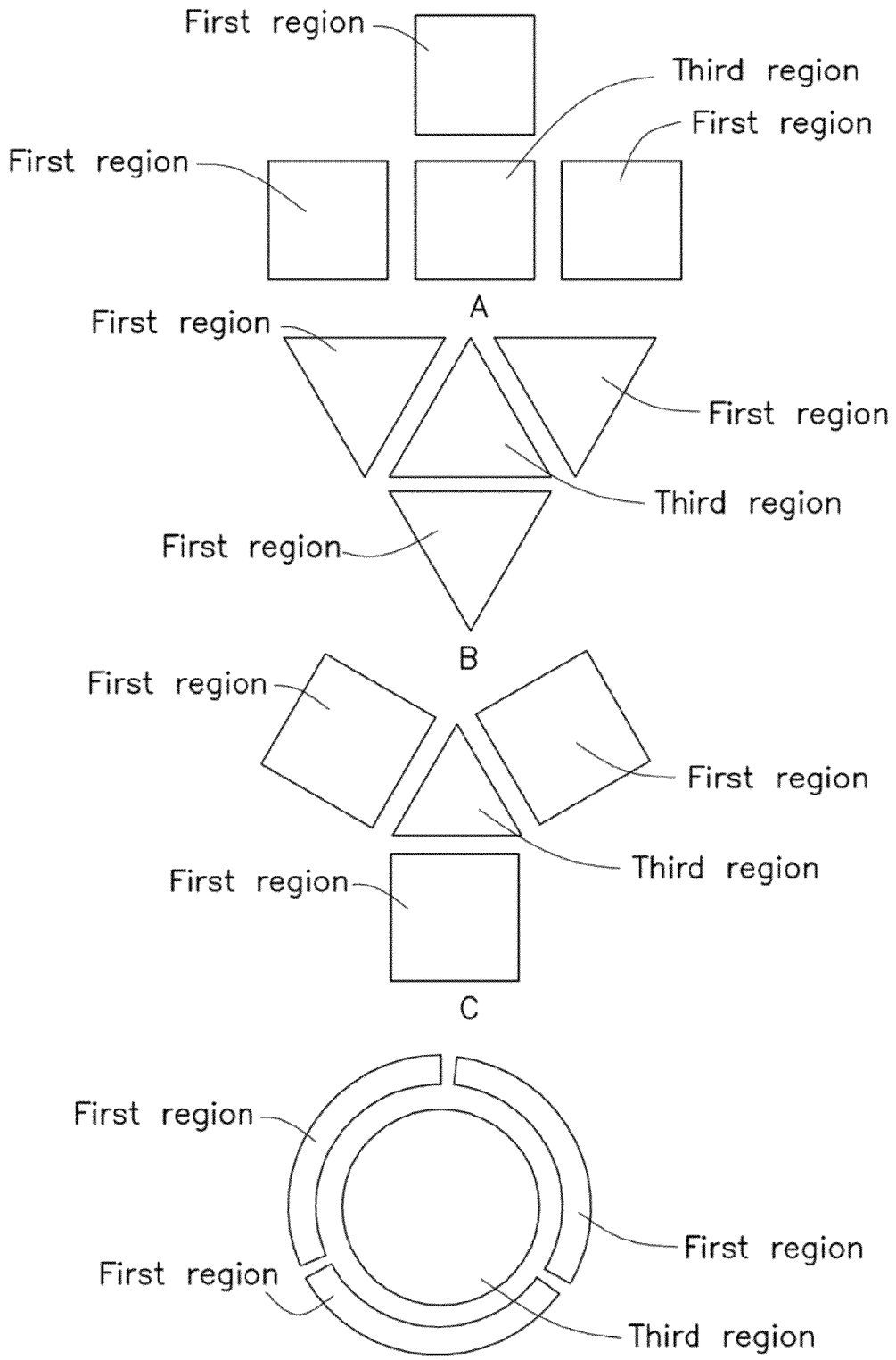
FIG. 3 shows a combination of the first region and the second region on a surface of the first semiconductor layer of the white LED.

The light emitting unit $L_1$, the light emitting unit $L_2$, the light emitting unit $L_3$, and the optical grating $G_1$ share the same first semiconductor layer 110, thus, a surface of the first semiconductor layer 110, away from the substrate 100, can include three first regions, a second region, and a third region based on their functions. The first regions can be used to locate the active layers 120 of the light emitting unit. The third region can be used to locate the active layer 170 of the optical grating $G_1$. The second region can be used to locate the first electrode 150. The first regions can be spaced apart from each other and are located around the third region. A distance between the first region and the third region can range from about 1 micron to about 1 millimeter. A shape of the first region and the third region can be triangle, square, rectangular, arc, circle, or other shapes. FIG. 3 illustrates that in some embodiments, the first regions and the third region can be a combination of square and square, a combination of triangle and triangle, a combination of square and triangle or a combination of arc and circle.

Each active layer 120 can be located on each first region of the first semiconductor layer 110. In one embodiment, each active layer 120 covers the entire surface of each first region. Each active layer 120 can be a photon excitation layer. The photon excitation layer can be a single layer quantum well film or multilayer quantum well films. A material of the active layer 120 can be GaN, GaInN, AlGaInN, GaSn, AlGaSn, GaInP, or GaInSn. A thickness of the active layer 120 can range from about 0.01 μm to about 0.6 μm. Each active layer 120 of the light emitting unit can be doped by different elements to emit red light, green light or blue light respectively.

The active layer 170 of the optical grating $G_1$ can be located on the third region of the first semiconductor layer 110. In one embodiment, the active layer 170 covers the entire surface of the third region of the first semiconductor layer 110. A material of the active layer 170 can be the same as the material of the active layers 120. A thickness of the active layer 170 can also be the same as the thickness of the active layer 120.

Each second semiconductor layer 130 of the light emitting unit can be located on a surface of each active layer 120, away from the first semiconductor layer 110. In one embodiment, each second semiconductor layer 130 covers the entire surface of each active layer 120. A thickness of the second semiconductor layer 130 can range from about 0.1 micron to about 3 micron. The second semiconductor layer 130 can be a N-type semiconductor layer or a P-type semiconductor layer. Furthermore, the type of the second semiconductor layer 130 is different from the type of the first semiconductor layer 110. In one embodiment, each second semiconductor layer 130 is a P-type gallium nitride doped with Mg and the thickness of the second semiconductor layer 130 is about 0.3 μm.

The second semiconductor layer 180 of the optical grating $G_1$ can be located on a surface of the active layer 170, away from the first semiconductor layer 110. In one embodiment, the second semiconductor layer 180 can cover the entire surface of the active layer 170, away from the first semiconductor layer 110. The second semiconductor layer 180 can be planar structure or a patterned structure. In one embodiment, the second semiconductor layer 180 includes a body 182 and a number of first three-dimensional nano-structures 184 protruding out of a surface of the body 182 to form the pattern structure.

The first three-dimensional nano-structures 184 can be linear protruding structures, dotted protruding structures or a combination of linear protruding structures and dotted protruding structures. A cross section of the linear protruding structure can be triangle, square, rectangular, trapezoidal, arc, semicircle, M-shape, or other shapes. A shape of the dotted protruding structures can be sphere, ellipsoid, single layer of truncated pyramid, multi-layer of truncated pyramid, single layer of prism, multi-layer of prism, single layer of frustum, multi-layer of frustum or other shapes. The first three-dimensional nano-structures 184 can be uniformly distributed to form an array. The first three-dimensional nano-structures 184 in the array can be substantially equidistantly arranged, concentric circularly arranged or concentric rectangle arranged.

Figure 4:
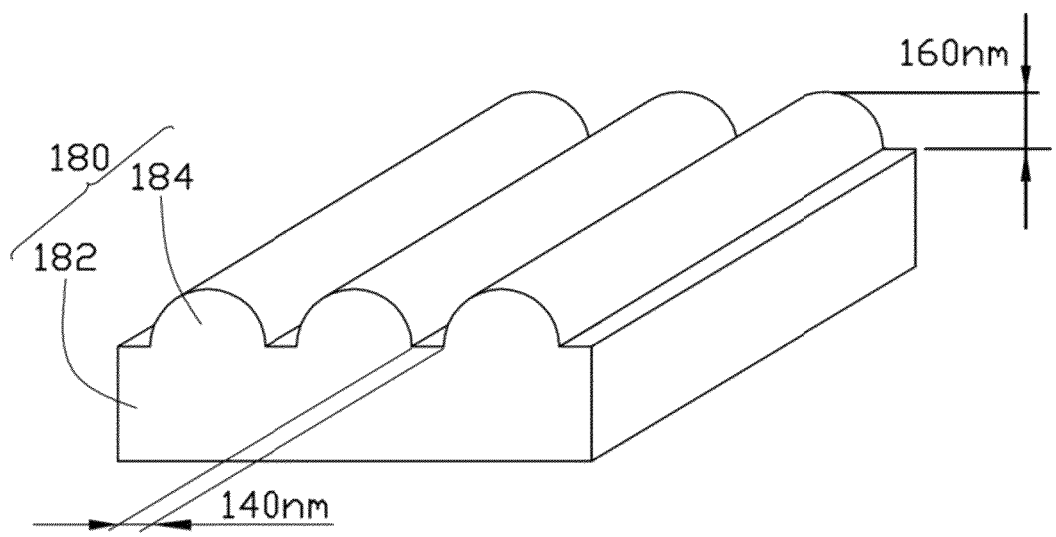
FIG. 4 is a schematic view of a second semiconductor layer of the white LED.
Figure 5:
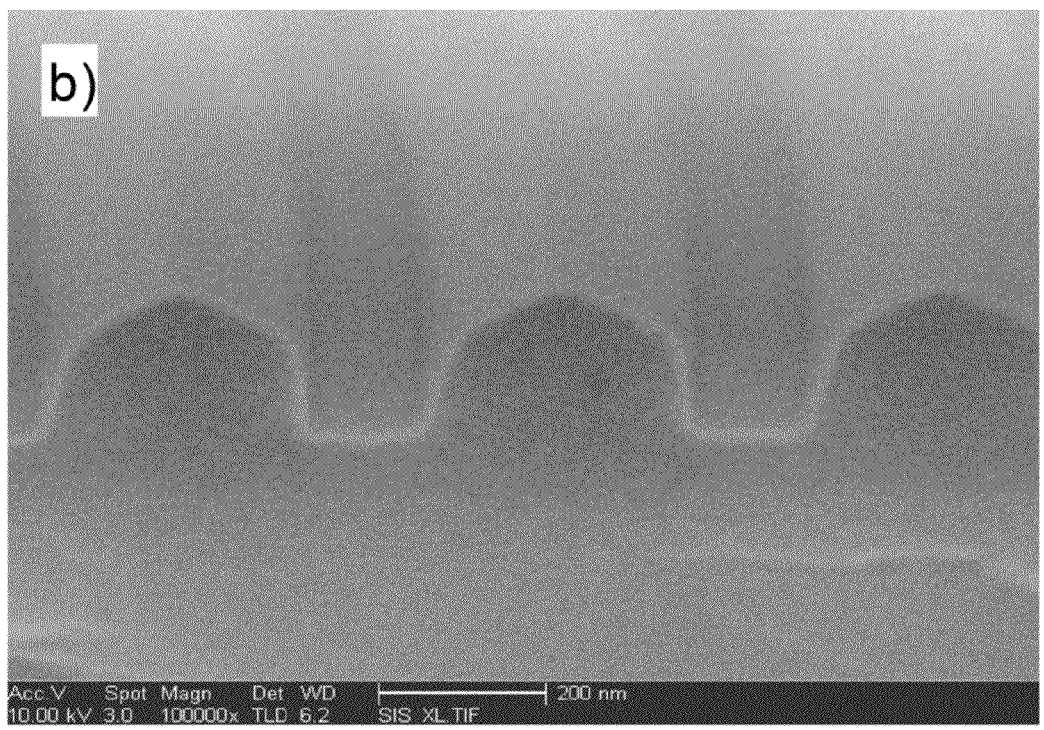
FIG. 5 shows a scanning electron microscope (SEM) image of the second semiconductor layer shown in FIG. 4.

FIGS. 4 and 5 illustrate that in one embodiment the optical grating $G_1$ includes a number of equidistantly arranged linear protruding structures. A distance between adjacent equidistantly arranged linear protruding structures can range from about 100 nanometers to about 200 nanometers. In one embodiment, the distance between adjacent equidistantly arranged linear protruding structures is about 140 nanometers. A cross section of the equidistantly arranged linear protruding structure along its length direction can be a semicircle, and a diameter of the semicircle can range from about 100 nanometers to about 200 nanometers. In one embodiment, the diameter of the semicircle is about 160 nanometers.

Each first reflector layer 140 of the light emitting unit can cover a surface of each second semiconductor layer 130 away from the active layer 120. A material of the first reflector layer 140 can be titanium, silver, aluminum, nickel, gold or any combination thereof. Each first reflector layer 140 includes a smooth surface having a high reflectivity. The photons reaching the first reflector layer 140 can be reflected by the first reflector layer 140, thus, the photons can be extracted from the sidewall of the light emitting units.

The first electrode 150 can be electrically connected to the first semiconductor layer 110 and spaced apart from the active layer 120. In one embodiment, the first electrode 150 covers a part of the surface of the third region. The first electrode 150 can be a single layer structure or a multi-layer structure. A material of the first electrode 150 can be selected from Ti, Ag, Al, Ni, Au, or any combination thereof. The material of the first electrode 150 can also be indium-tin oxide (ITO) or carbon nanotube film. In one embodiment, the first electrode 150 is a two-layer structure including a Ti layer with a thickness of about 15 nm and an Au layer with a thickness of about 200 nanometers. The number of the first electrodes 150 can be related to the number of the first semiconductor layers 110. In some embodiments, the first semiconductor layers 110 of the light emitting unit $L_1$, the light emitting unit $L_2$, and the light emitting unit $L_3$ are spaced apart from each other, thus, three first semiconductor layers 110 are needed.

Each second electrode 160 can be electrically connected to each second semiconductor layer 130 respectively. The shape of each second electrode 160 is arbitrary and can be selected according to need. Each second electrode 160 can cover a part or the entire surface of each second semiconductor layer 130 away from the active layer 120. A material of the second electrode 160 can be Ti, Ag, Al, Ni, Au, or any combination thereof. The material of the second electrode 160 can also be indium-tin oxide or carbon nanotube film. In one embodiment, each second electrode 160 is a two-layer structure including a Ti layer with a thickness of about 15 nm and an Au layer with a thickness of about 100 nanometers.

In some embodiments, a number of the second three-dimensional structures are located on a surface of the first semiconductor layer 110 away from the substrate 100 or on a surface of each active layer 120 away from the first semiconductor layer 110. The structures of the second three-dimensional structures can be the same as the structures of the first three-dimensional nano-structures 184. The second three-dimensional structures can be linear protruding structures, dotted protruding structures or a combination of linear protruding structures and dotted protruding structures. Therefore, a contact surface between the active layer 120 and the first semiconductor layer 110, and a contact surface between the active layer 120 and the second semiconductor layer 130 can be increased, and an electron-hole recombination density of each light emitting unit can be improved.

Furthermore, a second reflector layers (not shown) can be located on a surface of the substrate 100 away from the first semiconductor layer 110.

A sidewall of light emitting unit $L_1$ facing the optical grating $G_1$ is a light emitting surface of the light emitting unit $L_1$. A sidewall of light emitting unit $L_2$ facing the optical grating $G_1$ is a light emitting surface of the light emitting unit $L_1$. A sidewall of light emitting unit $L_3$ facing the optical grating $G_1$ is a light emitting surface of the light emitting unit $L_3$. Sidewalls of the optical grating $G_1$ are light introducing surfaces of the optical grating $G_1$. A surface of the second semiconductor layer 180 away from the active layer 170 is the light emitting surface of the optical grating $G_1$ and the white LED 10.

In use of the white LED 10, voltage is applied to each light emitting unit at the same time; thus, the holes and electrons can enter into each active layer 120 of each light emitting unit and combine with each other to emit red light, green light, and blue light respectively. Parts of the red light, green light, and blue light can enter into the optical grating $G_1$ and mix in the optical grating $G_1$ to form white light. Furthermore, parts of the white light can emit from the light emitting surface of the optical grating $G_1$. Alternatively, the voltage applied to each light emitting unit can be changed to obtain different kinds of visible light having different colors. In one embodiment, the white LED 10 includes the first three-dimensional nano-structures 184 located on the light emitting surface of the optical grating $G_1$, thus, the light extraction intensity can be further enhanced.

In some embodiments, the light emitting unit $L_1$, the light emitting unit $L_2$, the light emitting unit $L_3$, and the optical grating $G_1$ are located on the same plane and spaced from each other. A distance between each light emitting unit and the optical grating ranges from 1 micron to 1 millimeter. When the light emitting unit $L_1$, the light emitting unit $L_2$, the light emitting unit $L_3$, and the optical grating $G_1$ are spaced apart from each other, the optical grating $G_1$ can be a transparent structure having a number of three-dimensional nano-structures.

Figure 6:
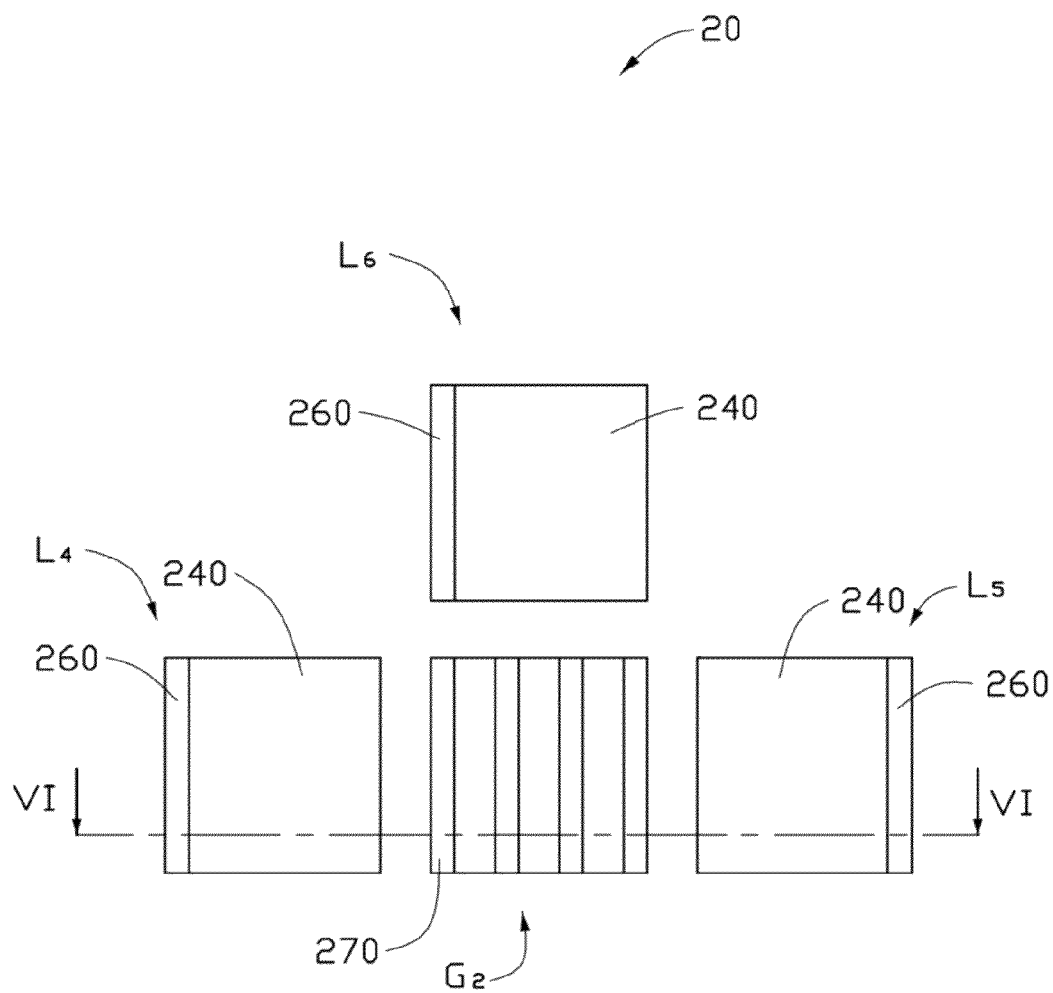
FIG. 6 is a top view of another embodiment of white LED.
Figure 7:
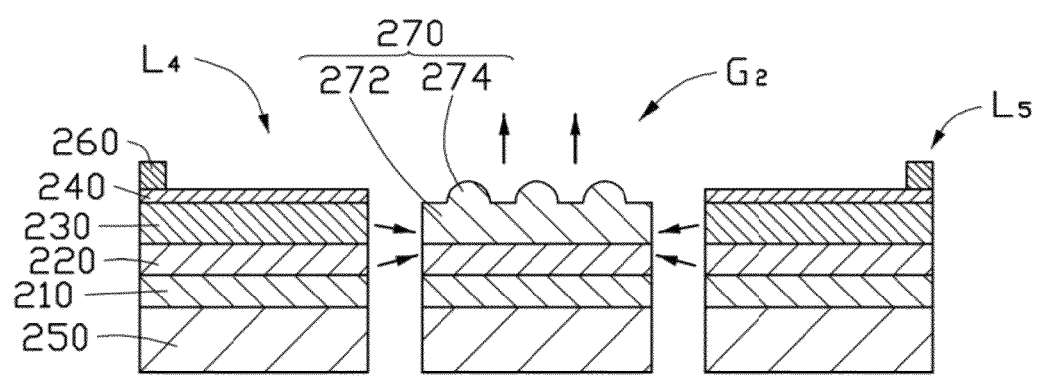
FIG. 7 is a cross-section of the white LED along line VI-VI of FIG. 6.

FIGS. 6 and 7 illustrate another embodiment of a white LED 20. The white LED 20 includes a light emitting unit $L_4$, a light emitting unit $L_5$, a light emitting unit $L_6$, and an optical grating $G_2$. The light emitting unit $L_4$, the light emitting unit $L_5$, the light emitting unit $L_6$ and the optical grating $G_2$ are located on a same plane and spaced from each other. The light emitting unit $L_4$, the light emitting unit $L_5$, and the light emitting unit $L_6$ are located around the optical grating $G_2$. The light emitting unit $L_4$ is a red LED chip, the light emitting unit $L_5$ is a green LED chip, the light emitting unit $L_6$ is a blue LED chip. In some embodiments, the light emitting unit $L_4$ is a red OLED (organic light emitting diode) chip, the light emitting unit $L_5$ is a green OLED chip, the light emitting unit $L_6$ is a blue OLED chip.

Each light emitting unit includes a first semiconductor layer 210, an active layer 220, a second semiconductor layer 230, a first reflector layer 240, a first electrode 250, and a second electrode 260. The first semiconductor layer 210, the active layer 220, the second semiconductor layer 230, and the first reflector layer 240 are stacked on a surface of the first electrode 250. The second electrode 260 is electrically connected to the second semiconductor layer 230. A sidewall of the light emitting unit $L_4$ facing the optical grating $G_2$ is a light emitting surface of the light emitting unit $L_4$. A sidewall of the light emitting unit $L_5$ facing the optical grating $G_2$ is a light emitting surface of the light emitting unit $L_5$. A sidewall of the light emitting unit $L_6$ facing the optical grating $G_2$ is a light emitting surface of the light emitting unit $L_6$.

The optical grating $G_2$ includes a first semiconductor layer 310, an active layer 320, a second semiconductor layer 270 and a first electrode 350. The first semiconductor layer 310, the active layer 320, the second semiconductor layer 270, and the second semiconductor layer 270 are stacked on a surface of the first electrode 350 in that order. A surface of the second semiconductor layer 270 away from the active layer 320 is a light emitting surface of the optical grating $G_2$ and the white LED 20. Sidewalls of the optical grating $G_2$ are light introducing surfaces of the optical grating $G_2$.

The second semiconductor layer 270 includes a body 272 and a number of first three-dimensional nano-structures 274 protruding out of a surface of the body 272. The structures of the first three-dimensional nano-structures 274 can be the same as the structures of the first three-dimensional nano-structures 184.

Alternatively, a third reflector layer can be located on a surface of each first electrode 250 away from the first semiconductor layer 210 and a surface of the first electrode 350 away from the first semiconductor layer 310. In one embodiment, each third reflector layer covers the entire surface of each first electrode 250 away from the first semiconductor layer 210 and the surface of the first electrode 350 away from the first semiconductor layer 310. A material of the third reflector layer can be the same as the material of the first reflector layer 140. The photons reaching the third reflector layer can be reflected by the third reflector layer, thus, these photons can be extracted from the sidewalls of the light emitting units.

The location of the white LED 20 is not limited, as long as the red light, green light and the blue light emitted from the light emitting unit $L_4$, light emitting unit $L_5$, and light emitting unit $L_6$ respectively can be enter into the optical grating $G_2$.

In some embodiments, the light emitting unit $L_4$, the light emitting unit $L_5$, the light emitting unit $L_6$, and the optical grating G₂ are an integrated structure. That is, the first electrodes 250 and the first electrodes 350 are a continuous integrated structure, and the first semiconductor layer 210 and the first semiconductor layer 310 are also a continuous integrated structure.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

What is claimed is:

1. A light emitting diode, comprising:
   a red light emitting unit, a green light emitting unit, a blue light emitting unit, and an optical grating located on a same plane, wherein the red light emitting unit, the green light emitting unit and the blue light emitting unit are located around the optical grating;
   each of the red light emitting unit, the green light emitting unit, and the blue light emitting unit comprises a first substrate, a first semiconductor layer, a first active layer, a second semiconductor layer, a first reflector layer, a first electrode, and a second electrode; the first substrate, the first semiconductor layer, the first active layer, the second semiconductor layer and the first reflector layer are stacked on each other and in order; the first electrode is electrically connected with the first semiconductor layer; and the second electrode is electrically connected with the second semiconductor layer;
   the optical grating comprises a second substrate, a third semiconductor layer, a second active layer, a fourth semiconductor layer stacked on each other in order;
   wherein, the second substrate and the first substrates of the red light emitting unit, the green light emitting unit, and the blue light emitting unit are a continuous integrated substrate structure.

2. The light emitting diode of claim 1, wherein a distance between the second active layer and each first active layer ranges from about 1 micron to about 1 millimeter.

3. The light emitting diode of claim 1, wherein the third semiconductor layer and the first semiconductor layers of the red light emitting unit, the green light emitting unit, and the blue light emitting unit are a continuous integrated semiconductor structure.

4. The light emitting diode of claim 3, wherein the continuous integrated semiconductor structure comprises a first surface having three first regions and a second region; and a distance between each the three first regions and the second region ranges from about 1 micron to about 1 millimeter.

5. The light emitting diode of claim 4, wherein the first surface further comprises a third region, and the first electrode partially covers a surface of the third region.

6. The light emitting diode of claim 4, wherein each first active layer is located on an entire surface of each first region, and the second active layer is located on an entire surface of the second region.

7. The light emitting diode of claim 4, wherein a combination of shapes of the three first regions and the second region is selected from the group consisting of a combination of square and square, a combination of triangle and triangle, a combination of square and triangle, and a combination of arc and circle.

8. The light emitting diode of claim 1, further comprising a second reflector layer that covers an entire surface of the continuous integrated substrate structure, away from the first reflector layer.

9. The light emitting diode of claim 1, wherein the fourth semiconductor layer comprises a body and a plurality of first three-dimensional nano-structures distributed on a surface of the body.

10. The light emitting diode of claim 9, wherein the plurality of first three-dimensional nano-structures are selected from the group consisting of linear protruding structures, dotted protruding structures and a combination of linear protruding structures and dotted protruding structures.

11. The light emitting diode of claim 10, wherein a cross-section of each of the linear protruding structures is triangle, square, rectangular, trapezoidal, arc, semicircle, or other shapes.

12. The light emitting diode of claim 10, wherein shapes of the dotted protruding structures are sphere, ellipsoid, single layer of truncated pyramid, multi-layer of truncated pyramid, single layer of prism, multi-layer of prism, single layer of frustum, or multi-layer of frustum.

13. The light emitting diode of claim 9, wherein the plurality of first three-dimensional nano-structures comprise a plurality of equidistantly arranged linear protruding structures, and a distance between adjacent equidistantly arranged linear protruding structures ranges from about 100 nm to about 200 nm.

14. The light emitting diode of claim 13, wherein a cross section of each equidistantly arranged linear protruding structure along its length direction is a semicircle, and a radius of the semicircle ranges from about 50 nm to about 100 nm.

15. The light emitting diode of claim 1, wherein a surface of the fourth semiconductor layer, away from the second active layer, is a light emitting surface of the light emitting diode.

* * * * *